(12) United States Patent
Emoto et al.

(10) Patent No.: US 7,508,646 B2
(45) Date of Patent: Mar. 24, 2009

(54) SUBSTRATE HOLDING TECHNIQUE

(75) Inventors: Keiji Emoto, Utsunomiya (JP); Atsushi Ito, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 543 days.

(21) Appl. No.: 10/879,074

(22) Filed: Jun. 30, 2004

(65) Prior Publication Data

US 2005/0016685 A1   Jan. 27, 2005

(30) Foreign Application Priority Data

Jun. 30, 2003   (JP)   ............................ 2003-187432

(51) Int. Cl.
*H01T 23/00*   (2006.01)
(52) U.S. Cl. ...................... 361/234; 361/230
(58) Field of Classification Search ......... 361/230–234; 156/345.51; 355/72, 75
See application file for complete search history.

(56) References Cited

U.S. PATENT DOCUMENTS

| 5,220,171 | A | * | 6/1993 | Hara et al. ................. 250/443.1 |
| 6,226,073 | B1 | | 5/2001 | Emoto .......................... 355/53 |
| 6,488,820 | B1 | * | 12/2002 | Burkhart ................... 204/192.1 |
| 6,552,773 | B2 | | 4/2003 | Emoto .......................... 355/53 |
| 6,716,301 | B2 | * | 4/2004 | Kanno et al. ............ 156/345.28 |
| 7,199,327 | B2 | * | 4/2007 | Moroz et al. ............ 219/121.41 |
| 7,209,339 | B2 | * | 4/2007 | Kitabayashi et al. ........ 361/234 |
| 2001/0055102 | A1 | | 12/2001 | Emoto .......................... 355/53 |
| 2002/0000029 | A1 | | 1/2002 | Emoto ........................ 29/25.01 |
| 2002/0081528 | A1 | | 6/2002 | Miyajima et al. ............ 430/302 |
| 2002/0132409 | A1 | | 9/2002 | Akutsu et al. ................ 438/200 |
| 2003/0007136 | A1 | | 1/2003 | Emoto et al. ................... 355/30 |
| 2003/0035088 | A1 | | 2/2003 | Emoto .......................... 355/53 |
| 2004/0080727 | A1 | | 4/2004 | Emoto .......................... 355/30 |
| 2006/0023393 | A1 | * | 2/2006 | Poh .............................. 361/234 |

FOREIGN PATENT DOCUMENTS

| JP | 4-250615 | | 9/1992 |
| JP | 9-237827 | | 9/1997 |
| JP | 02002252275 A | * | 9/2002 |
| JP | 2003-58258 | | 2/2003 |
| JP | 2003-142393 | | 5/2003 |

* cited by examiner

*Primary Examiner*—Danny Nguyen
(74) *Attorney, Agent, or Firm*—Fitzpatrick, Cella, Harper & Scinto

(57) ABSTRACT

A stage system includes a fine-motion stage on which a substrate holding member for holding a substrate is mounted, a rough-motion stage on which the fine-motion stage is mounted, a stage for supporting and moving a substrate, and a probe configured to measure a potential of the substrate without contact thereto, the probe being supported by the rough-motion stage so as to be opposed to one of a bottom face and a side face of the substrate.

14 Claims, 12 Drawing Sheets

SUBSTRATE HOLDING TECHNIQUE

FIELD OF THE INVENTION AND RELATED ART

This invention relates to the manufacture of devices, such as microdevices, for example. More particularly, the invention concerns technology for holding a substrate in photolithography, for example.

In charged-particle beam pattern drawing apparatuses, if the electrical potential of a wafer during the pattern drawing is not 0V, the track of a charged-particle beam is adversely influenced thereby and the pattern drawing precision is, therefore, degraded. In order to avoid this, conventionally, as shown in FIGS. 10A and 10B, by using an electrically conductive diamond needle, or the like, an earth pin 218 is stuck into a wafer 202 so that the latter is directly grounded (Japanese Laid-Open Patent Application No. 9-237827). However, the wafer is disadvantageously damaged.

Japanese Laid-Open Patent Application No. 4-250615 discloses a structure such that, as shown in FIG. 11, a probe 305 of a non-contact electrometer 308 is disposed opposed to the surface of a wafer 202 to measure the electrical potential on the wafer 202 surface. On the basis of the measured value, an applied voltage to an electrode 303 of a wafer chuck 301 is changed to thereby control the potential to zero. Denoted at 306 is a control circuit for variably controlling the applied voltage to the electrode 303.

Japanese Laid-Open Patent Application No. 9-237827 discloses a technique of replacing an electrostatic chuck 201 while a sample 202 on a stage 209 is held attracted to the electrostatic chuck 201, as well as a technique of fixing the electrostatic chuck 201 onto the stage 209. According to this document, as shown in FIG. 10, electrostatic attraction means comprising a three-point supporting member 204 is provided on the stage 209, and the electrostatic chuck 201 for substrate holding is fixed to the stage 209.

The structure such as shown in FIG. 11 has an advantage that it eliminates the necessity of physically sticking an earth pin into the wafer 202. However, since the wafer 202 surface has to be scanned by the charged-particle beam 310 throughout the entire surface, it is difficult to place the probe 305 of the non-contact electrometer 308 at a position that can avoid the track of the charged-particle beam 310 and yet that can measure the potential while being opposed to the wafer 202, constantly, during the exposure. This may be solved by providing a mechanism for moving the probe 305 in accordance with the relative position of the wafer 202 and the track of the charged-particle beam. However, the structure becomes quite complicated. If the probe 305 is disposed obliquely above the wafer 202, interference with the track of the charged-particle beam 310 may be avoided. However, depending on the relative position between the wafer 202 and the charged-particle beam 301, the wafer 202 goes out of the measurement range of the non-contact electrometer 308, that is, the range in which the wafer 202 and the probe 305 are opposed to each other, and the potential measurement becomes unattainable. To avoid this, it would be necessary to use a plurality of probes 305 which should be used interchangeably.

As described above, the structure shown in FIG. 11 necessarily complicates the system, if it is going to be realized. Actually, therefore, it has not been used practically in an electrostatic chuck for an electron beam pattern drawing apparatus. Furthermore, the probe 305 of the non-contact electrometer is equipped with electrical wires and cooling tubes and, additionally, it has a chopper which vibrates constantly during the measurement. Therefore, if the non-contact electrometer probe 305 is incorporated into a positioning system having fine-motion and rough-motion stages and when it is disposed at the fine-motion stage side, due to the influence of wires, tubes and the vibration of a chopper, the positioning precision would be degraded undesirably.

Generally, the wafer surface is coated with a photosensitive material, called a resist. The resist is a factor that causes an error in the measurement of the wafer potential. Usually, the non-contact type surface electrometer measures the electrostatic capacitance between the electrometer probe and a measurement object (wafer, in this case) through a chopper, and the measured value is AC modulated and is outputted as a potential. If, therefore, there is dispersion in the film thickness of the resist, the electrostatic capacitance between the wafer and the probe varies and the output becomes unstable.

Considering the conventional structure, such as shown in FIGS. 10A and 10B, as a method of fixing an electrostatic stage onto a stage, or the like, in order to assure reproducibility of self-weight distortion of the chuck 201 due to the three-point support, the three-point supporting area by the supports 204 should be made as small as possible. However, to the contrary, in order to hold the chuck 201 tightly so that it does not move during acceleration and deceleration of the stage 209, the three-point supporting area of the supports 204, applying an electrostatic attraction force, should be made large. For this reason, it is not easy to assure a sufficient holding force, while assuring good reproducibility of chuck distortion through the three-point support. Depending on the design condition, it may be too hard to design the three-point supporting members 204.

On the other hand, generally, an electrostatic chuck needs electrical transfer (connection) between the chuck and a base member, such as a stage, to afford a potential to an electrode. For this reason, in many cases, a contact type connector comprising a leaf spring, for example, is used between them. However, if the spring constant of the leaf spring is made large so as to secure electrical connection, the rigidity between the base member and the chuck in this portion cannot be disregarded. In a worst case, the fixation is no longer the three-point support, and the three-point supporting structure does not function. Thus, it is desirable to provide a structure that enables an assured electrical connection while securing good reproducibility of chuck distortion.

SUMMARY OF THE INVENTION

It is accordingly an object of the present invention to provide a unique and an effective technique related to holding a substrate, by which at least one of the inconveniences described above can be solved.

In accordance with an aspect of the present invention, there is provided a stage system, comprising a stage for supporting and moving a substrate, and a probe for measuring a potential of a substrate without contact thereto, the probe being supported by the stage so as to be opposed to one of a bottom face and a side face of the substrate.

In accordance with another aspect of the present invention, there is provided a stage system, comprising a substrate holding member for holding a substrate, the substrate holding member having a protrusion and a first electrode, the first electrode being provided inside the substrate holding member and adjacent to the protrusion, a terminal for adjusting a potential of the first electrode, and a stage for supporting and moving the substrate holding member through the terminal.

In accordance with a further aspect of the present invention, there is provided a substrate holding system, comprising a plurality of protrusions to be supported by a stage, and a plurality of first electrodes disposed adjacent to the plurality of protrusions, respectively, and for electrostatically attracting the stage.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
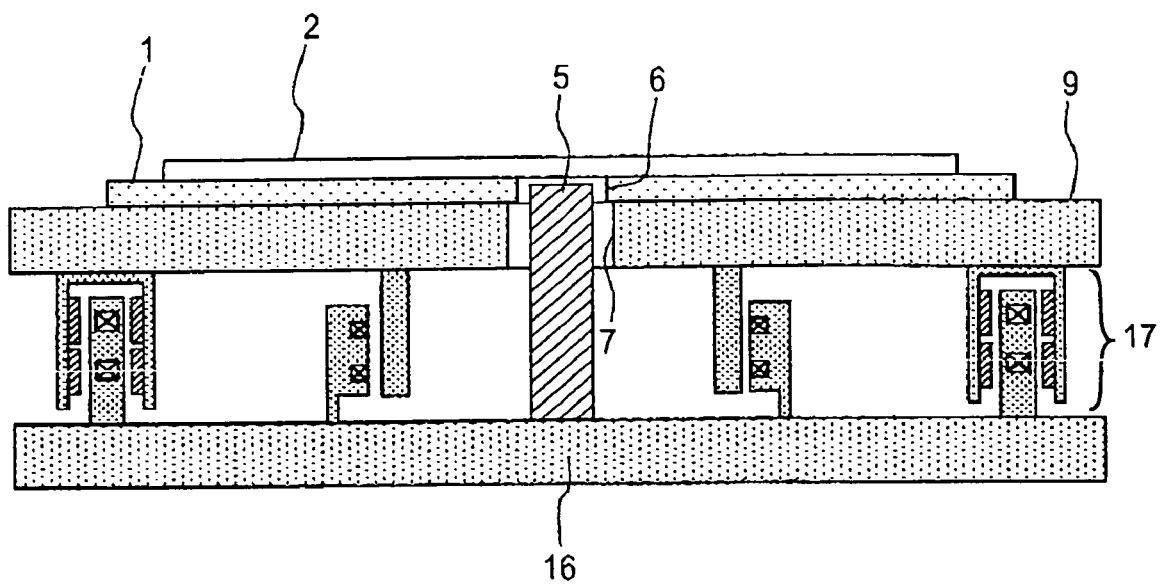
FIG. 1 is a schematic view of a general structure of a rough-motion and a fine-motion stage system according to an embodiment of the present invention.

Preferred embodiments of the present invention will now be described with reference to the attached drawings.

One preferred form of the present invention aims at enabling accurate measurement of the potential of a substrate upon a stage without contact thereto and without use of a complicated mechanism, and it proposed a structure for doing this. In this embodiment, the substrate is a wafer being coated with a resist, and such a potential measuring method that the wafer potential is measured to a portion of the wafer not coated with the resist, by use of a non-contact electrometer, is proposed. Also, a chuck structure suitable to such measurement is proposed, wherein an electrostatic chuck is provided with an opening or notch for accommodating a non-contact electrometer for measuring the wafer potential from the bottom face of the wafer, to thereby enable that the wafer potential is measured constantly without the pattern drawing. The attracting electrode of this electrostatic chuck is a bipolar type, and the wafer electrode is controlled to zero by changing the applied voltage to the electrode, on the basis of an output of the non-contact electrometer. This eliminates the necessity of a structure that an earth pin is stuck into a wafer.

Here, the electrode area or the electrode applied voltage may be set so as to make, equal to zero, the total sum of products of the areas of the electrodes and the applied voltages and, on that occasion, the variable amount of the applied voltage can be made small. Also, when the area of the electrode to which a variable voltage is applied is made largest, among the electrodes, the variable amount of the applied voltage can also be made small. Additionally, when the applied voltage to the electrode having a relatively small absolute value of an applied voltage is made variable, the influence of a variation in electrostatic attraction force to the attraction of the substrate can be reduced. Also, when such an electrostatic chuck should function also as a vacuum chuck, the opening for the non-contact electrometer may be used as a vacuum evacuation bore for vacuum attraction. This makes the structure very simple. Furthermore, in a positioning system having a rough-motion and a fine-motion stage, the non-contact electrometer should preferably be disposed at the rough-motion stage side.

Another preferred form of the present invention aims at achieving an attracting force necessary for fixing a substrate holding member such as an electrostatic chuck to a stage, while securing advantages of a structure that supports the substrate holding member at three points, and it proposes a structure effective to solve this. In this embodiment, as a method of fixing a chuck to a base member such as stage means, for example, three supporting members are provided at the bottom side of the chuck, and additionally, electrodes for activating a non-contact electrostatic attraction force adjacent to the supporting members are provided, whereby the attracting force is assured. Each of the three supporting members may particularly preferably have a structure having a protrusion. An electrode for substrate attraction and an electrode for activating electrostatic attraction are electrically connected, by which the number of electrical wires and connection required to be transferred between the base member and the chuck, can be reduced. When the electrode has a monopole structure, the number of electrical wires and connection can be reduced much more.

In an electrostatic chuck having three protrusions such as described above, these protrusions and/or the portions around them may be used as a terminal for electrical connection with a base member for fixing the electrostatic chuck. This maximizes the advantage of the three-point support and fixation.

The preferred forms of the present invention described above may be embodied in combination.

Referring to the drawings, embodiments of the present invention will now be described.

First Embodiment

FIG. 1 illustrates the structure of a stage system for use in an exposure apparatus, according to a first embodiment of the present invention. Denoted in FIG. 1 at 1 is a chuck (substrate holding member), and denoted at 2 is a wafer (substrate). Denoted at 5 is a probe of a non-contact electrometer, and denoted at 6 is a throughbore (opening) formed at a central position of the chuck 1. Denoted at 9 is a fine-motion stage, and denoted at 7 is a throughbore (opening) formed in the fine-motion stage 9, in association with the throughbore 6 of the chuck. Denoted at 16 is a rough-motion stage, and denoted at 17 is a linear motor. The chuck 1 is fixed onto the fine-motion stage 9. A substrate, such as a semiconductor wafer 2, for example, having a surface coated with a resist, is mounted on the chuck 1 and is held thereby. The fine-motion stage 9 is floated with respect to the rough-motion stage 16, by means of a non-contact type weight cancellation mechanism (not shown). The position thereof is adjusted without contact thereto, through the linear motor 17. With this arrangement, vibration is insulated between the rough-motion stage 16 and the fine-motion stage 9.

The non-contact probe 5 is mounted on the rough-motion stage 16. Through the throughbore 6 formed in the chuck 1, the probe 5 is opposed to the bottom face of the wafer 2 placed on the chuck 1. Thus, by means of a non-contact electrometer (not shown) connected to the non-contact electrometer probe 5, the electrical potential of the wafer 2 can be measured from its bottom face side, without contact thereto. The non-contact electrometer probe 5 having a chopper being vibrated continuously during the potential measurement is mounted on the rough-motion stage 16 and, additionally, wires or cooling tubes (not shown) connected to or annexed to the non-contact electrometer probes 5 are provided on the rough-motion stage. This effectively presents degradation of positioning precision of the fine-motion stage 9.

If the potential is measured from the top face side of the wafer 2, as is conventional, it is difficult to measure the wafer potential during the pattern drawing operation without interference with the track of the charged-particle beam. With the structure of this embodiment, to the contrary, the wafer potential can be measured easily. Here, as compared with the gap between the wafer 2 and the non-contact type electrometer probe 5, the wafer 2 can be regarded as being an electrically conductive material and, therefore, the wafer 2 as a whole can be regarded as having the same potential. For this reason, there arises no problem even if the potential at the bottom face of the wafer 2 is measured and the measured potential is regarded as the potential of the top surface of the wafer 2. Furthermore, since the bottom face of the wafer has no resist, which may be an error factor in the potential measurement, the potential measurement from the bottom face side can assure more exact measurement as compared with the measurement from the top surface side.

On the basis of the result of measurement of the potential of the wafer 2, made as described above, the potential applied to an electrode (not shown) mounted on the wafer bottom surface through an insulative member (or dielectric member) may be adjusted, as disclosed in the aforementioned Japanese Laid-Open Patent Application No. 4-250615, and the potential of the wafer 2 can be made equal to zero V (ground potential). When the chuck 1 is an electrostatic chuck having a wafer attracting electrode, the electrode for wafer attraction may be used also as the wafer potential adjusting electrode.

Second Embodiment

Figure 2:
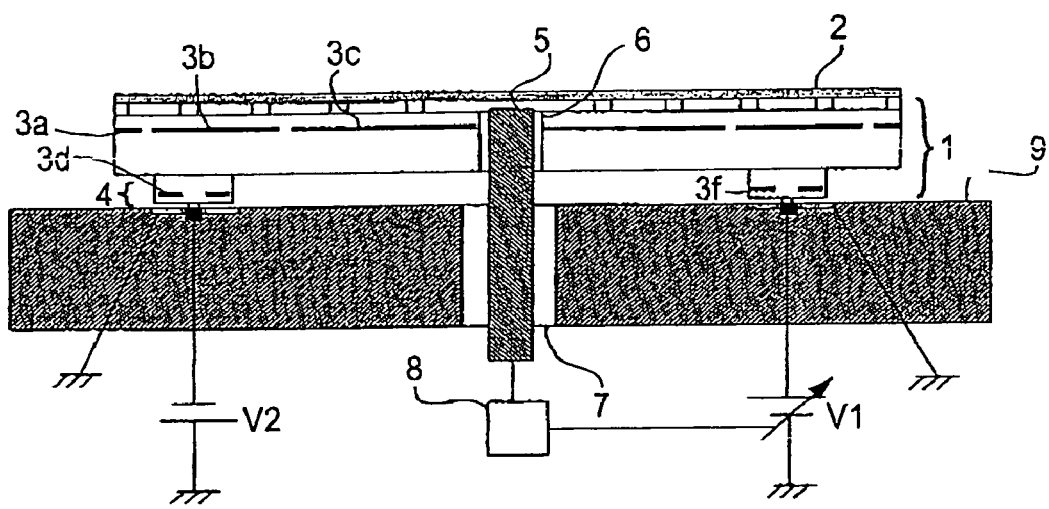
FIG. 2 is a schematic view of a general structure of a stage system according to a second embodiment of the present invention.

FIG. 2 shows the structure of a stage system according to a second embodiment of the present invention. In FIG. 2, components corresponding to those shown in FIG. 1 are denoted by corresponding reference numerals, and a detailed description of them is omitted here. In FIG. 2, denoted at 8 is a wafer potential control system, and denoted at 3a-3c are electrodes (first electrostatic attraction electrodes) for wafer attraction. The wafer potential control system 8 serves to adjust, finely, an applied voltage V1 to the wafer attracting electrode 3c. By this, the balance of potential among the electrodes 3a-3c is adjusted such that the wafer 2 potential can be adjusted to be equal to zero V (ground potential).

Figure 3:
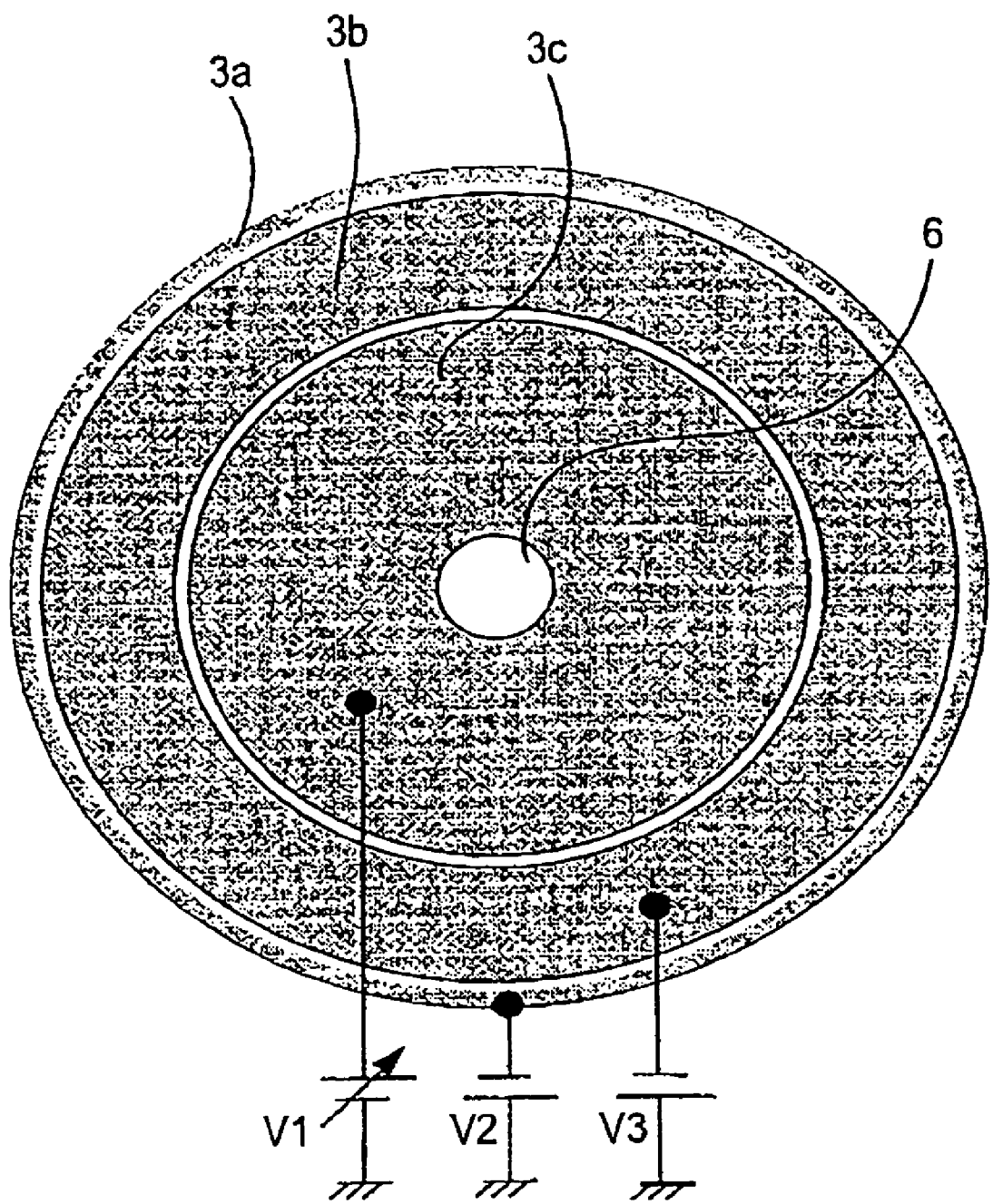
FIG. 3 is a schematic view for explaining the relationship between substrate attracting electrodes and applied voltages, in the stage system shown in FIG. 2.

FIG. 3 illustrates the relationship between the placement of the wafer attracting electrodes and applied voltages thereto. There are three ring-like electrodes 3a-3c formed concentrically. Applied voltages V1-V3 to them are determined in accordance with the attracting force required for holding the wafer 2 by attraction. For example, in order to hold the wafer 2 by attraction stably, a large attracting force should be produced in the region at the outermost periphery of the chuck (i.e., the region corresponding to the electrode 3c). On the other hand, in the region at the innermost periphery (i.e., at the region corresponding to the electrode 3a), a large attracting force is not required. At the region between them (i.e., the region corresponding to the electrode 3b), an intermediate attracting force is necessary. In consideration of this, the applied voltages to the electrodes 3a-3c may be determined so as to satisfy a relation $V2 \leq V3 \leq V1$.

However, practically, it is difficult to make the wafer potential equal to 0V merely by applying voltage to the electrodes, corresponding to the required attracting forces, respectively. In fact, depending on the balance of the applied voltages, the adjustment width of voltage V1 may become large, and the attracting force at the region corresponding to the electrode 3a may largely differ from a design value (required attracting force) when the wafer 2 potential is made equal to 0V. In consideration of this, it is necessary to make such an electrode structure that the wafer potential becomes substantially equal to zero V on the basis of the applied voltages (V1-V3) determined in accordance with the required attracting force. Taking this into account, in this embodiment, the electrode area is designed so that the total sum of the products of applied voltages to the electrodes and the areas of them becomes equal to zero. Namely, when expressed by an equation, the electrodes are designed to satisfy the following relation:

$$\Sigma_i S_i \cdot V_i = 0$$

where S is the electrode area, V is the applied voltage to the electrode, and subscript "i" corresponds to the number of each electrode.

For example, if the applied voltages to the electrodes 3a, 3b and 3c as calculated from the required attracting force are determined as a ratio 1000:500:−350 [V], theoretically, the wafer potential can be made equal to 0V in response to the application of these voltages if the ratio of electrode areas of the electrodes 3a-3c is made equal to 1:5:10. Since, however, there is dispersion of contact electrical resistance due to the state of contact between the wafer 2 and the chuck 1, for example, or because of an influence of a charged particle flowing into the wafer during the pattern drawing, the wafer potential cannot be exactly equal to zero V. Thus, the applied voltage V1 to the electrode 3c may be finely adjusted, by which the wafer potential can be controlled to 0V. As regards the adjustment amount for the voltage V1, although it depends on the electrode design, practically, the amount can be held to 10% or less of the voltage V1.

The applied voltage to the electrode 3c is made variable, and this is because the required attracting force of the region corresponding to the electrode 3c is relatively small. Namely, in this region, the influence of variation in the attracting force resulting from changing the applied voltage is relatively small and, for this reason, the electrode 3c is chosen as the electrode for which the applied voltage is to be made variable. Furthermore, as seen from the equation set forth above, if it is necessary to make the voltage changing amount for such a variable voltage electrode small, enlarging the electrode S is effective. Also, if the electrode corresponding to the region in which the required electrostatic attraction force is smallest is chosen as a variable voltage electrode, the area of that electrode may be made largest, and on that occasion, the voltage changing amount can be held smallest.

In exposure apparatuses, only a wafer may not be replaced each time it is exposed, but rather, as disclosed in Japanese Laid-Open Patent Application No. 2003-142393, the wafer may be replaced while it is kept mounted on the chuck. Namely, there may be a system in which the chuck conveyance is performed for every wafer replacement. On that occasion, the wafer can be held on the chuck beforehand, outside the exposure space, and yet the holding operation can be done in the atmosphere. Thus, wafer vacuum attraction can be done. For vacuum attraction, it is necessary to use a throughbore for vacuum evacuation of the clearance between the wafer and the chuck. In this embodiment, vacuum attraction is attainable by use of the aforementioned throughbore 6, which is provided in the electrostatic chuck 1 in relation to the non-contact electrometer. Thus, the present embodiment enables a chuck that functions as an electrostatic chuck and also as a vacuum chuck, with a very simple structure.

Figure 4:
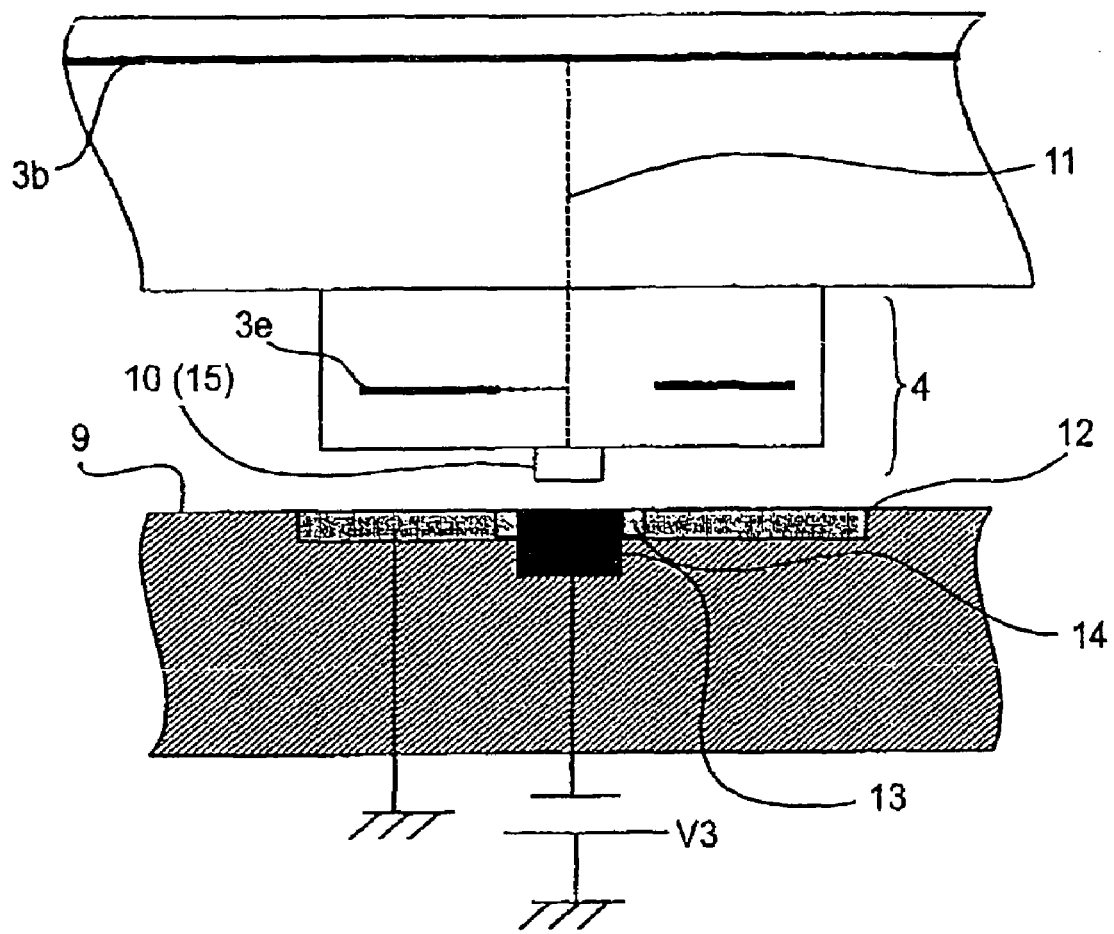
FIG. 4 is a schematic and an enlarged view of a chuck supporting and fixing portion, in the stage system shown in FIG. 2.
Figure 5:
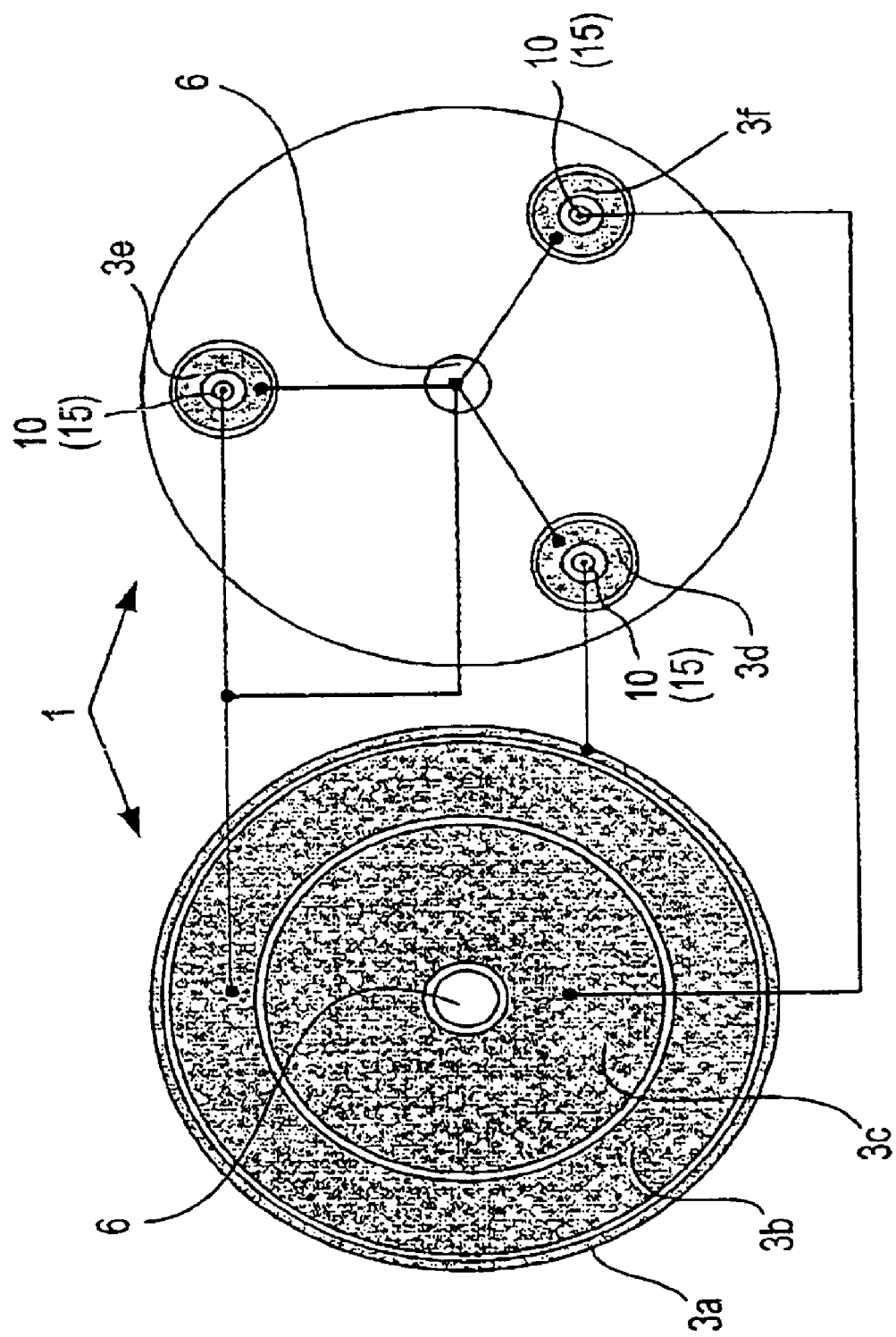
FIG. 5 is a schematic view for explaining the relationship of electrical connection between top and bottom electrodes and voltage applying terminals, in the stage system shown in FIG. 2.
Figure 6:
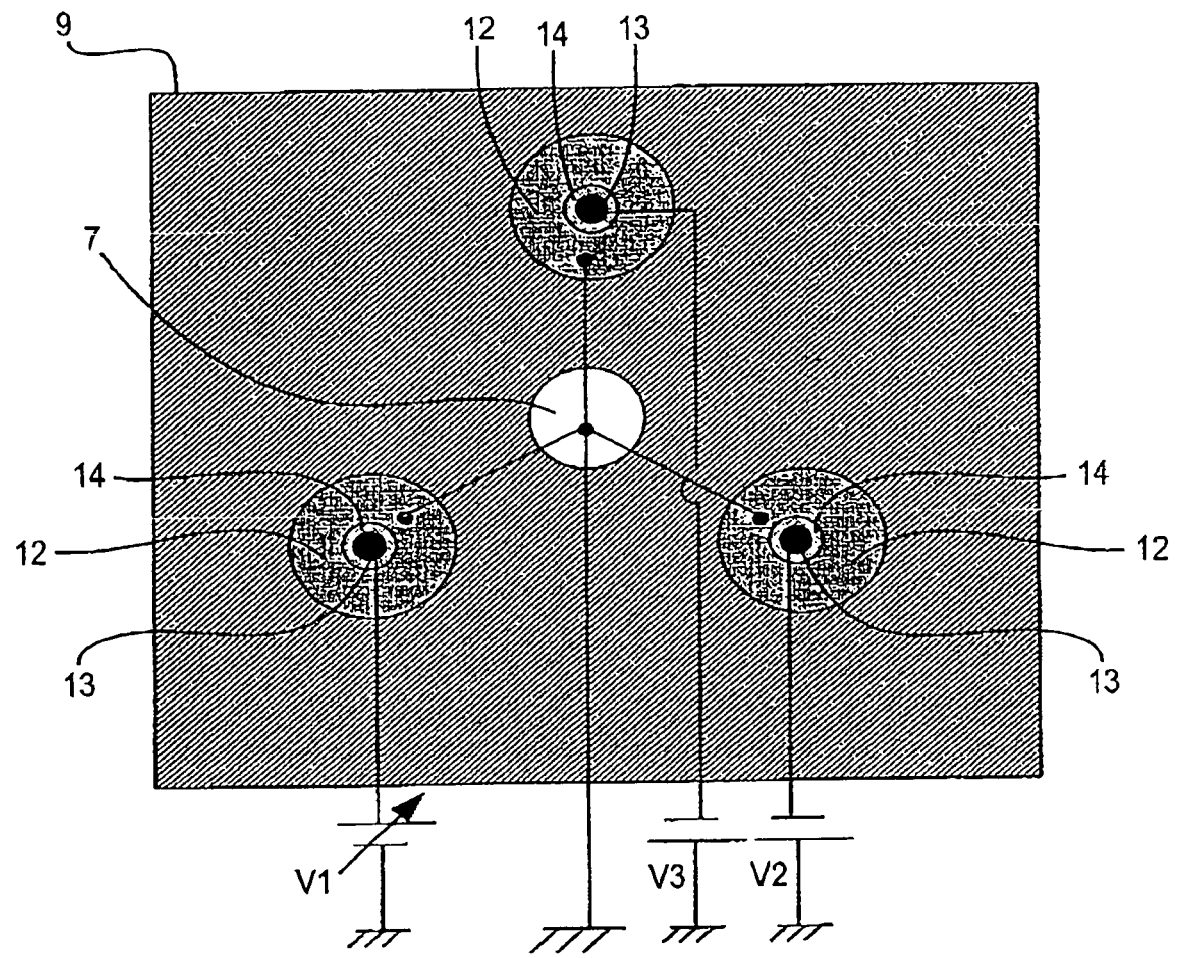
FIG. 6 is a schematic view for explaining the relationship of electrical connection between a supporting member and voltage applying terminals, in the stage system shown in FIG. 2.

Referring to FIGS. 2 and 4-6, the manner of fixing an electrostatic chuck to a stage will be explained. FIG. 2 is a sectional view of a chuck and a stage, as seen from the side thereof. FIG. 4 is an enlarged view of the three-point support of the chuck, in a state that it floats slightly from the stage. A broken line 11 depicts electrical connection between each of the electrodes and a protrusion 10. FIG. 5 illustrates the electrode structure of the chuck; as seen from its top face and the bottom face, respectively. The left-hand side of the drawing depicts the wafer attracting electrode structure (second electrostatic attraction electrode), as seen from the top surface (wafer attracting surface). The right-hand side of the drawing depicts the chuck fixing electrode structure (first electrostatic attraction electrode) as seen from the bottom face (stage side). Also, this drawing depicts the stage of electrical connection to the electrodes. FIG. 6 shows the structure of the stage side portion as opposed to the chuck, and it illustrates a member corresponding to the three-point supporting members and an earth electrode structure, as well as the state of electrical connection of them.

In order to assure a good reproducibility of chuck distortion as the chuck 1 is fixed to the stage 9, the chuck 1 is supported by the stage 9 by use of three protrusions 10, each having an area as small as possible (e.g., ø2 mm or less). Because the pins have a small area, there is almost no attracting force acting between the chuck 1 and the stage 9. In this embodiment, therefore, the chuck supporting member 4 is made of a dielectric material and there are electrodes $3d$, $3e$ and $3f$ provided so that an attraction force is applied around the pin 10 without any contact. Here, for simplicity of the electrodes, each electrode is made with a monopole structure, and, additionally, an earth electrode 12 provided in a stage side portion to be opposed to the electrode $3d$ ($3d$, $3f$). Further, in order to assure that the attracting force acts through this electrode, even without contact, the height of the pin 10 is set to be not greater than 20 µm.

Figure 10A:
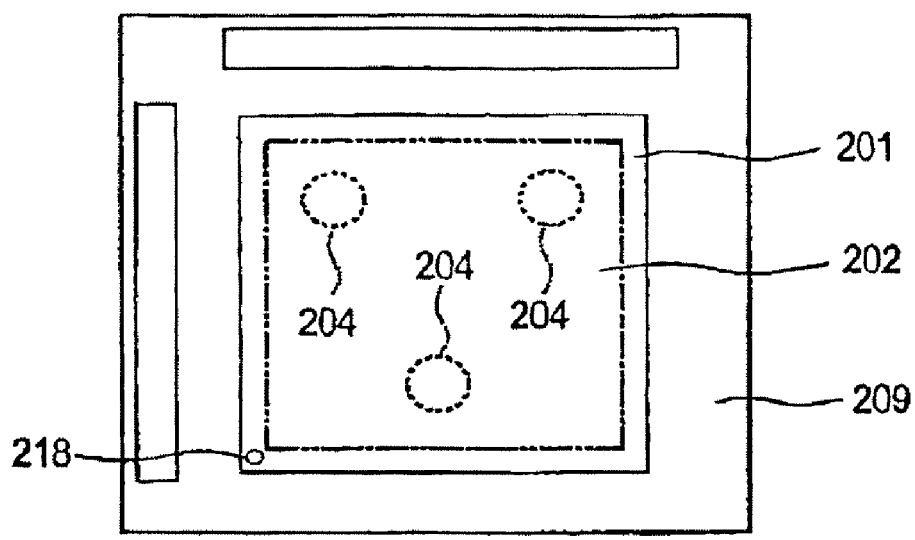
FIGS. 10A and 10B illustrate a conventional manner of chuck fixation.
Figure 10B:
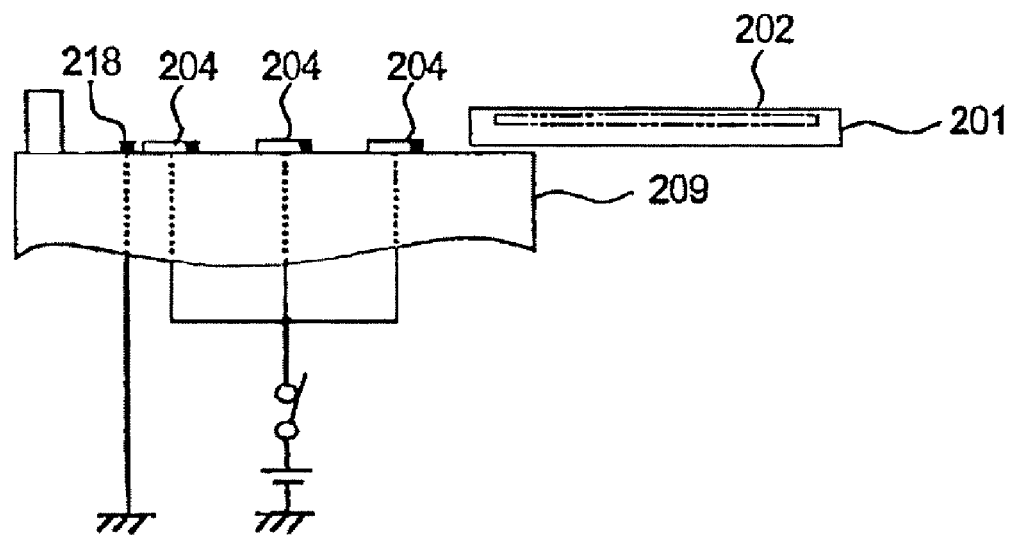
Figure 11:
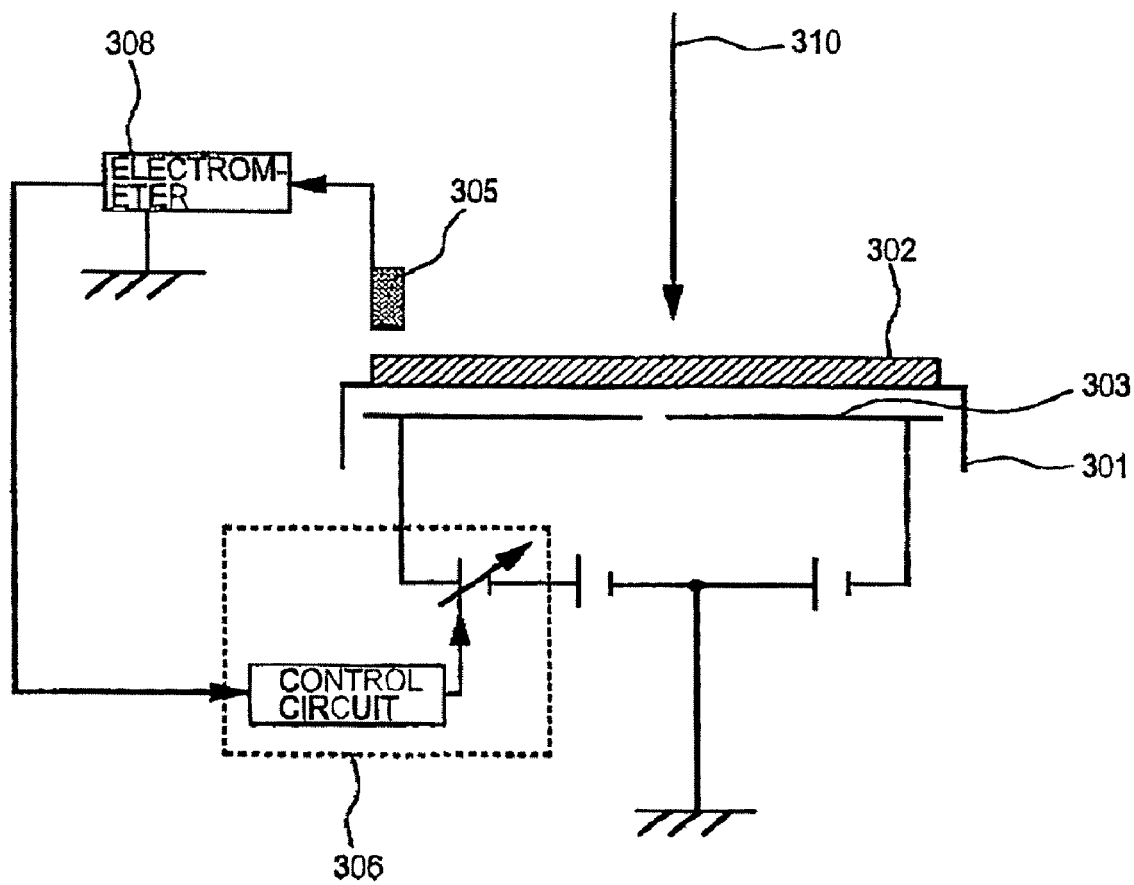
FIG. 11 illustrates a conventional manner of wafer surface potential control.

In the conventional structure of FIGS. 10A and 10B, the dielectric member and electrodes are disposed on the stage 1, and an electrostatic attracting function is provided thereby. In this embodiment, however, as shown in FIG. 4, the dielectric member and the electrodes ($3d$, $3e$, $3f$) are disposed at the chuck side. Generally, in an electrostatic chuck, heat is produced by a very small flow of electrical currents flowing through a dielectric material. Therefore, heat is produced at the side where a dielectric member and an electrode are disposed. Namely, in the conventional structure, it can be said that a heat generating member is provided at the stage 1 side, and this requires use of cooling means for the stage. Additionally, it is inherently inevitable to avoid heat generation in the chuck at the electrodes $3a$-$3c$ for the wafer attraction. In consideration of these inconveniences, in this embodiment of the present invention, also regarding the electrostatic attraction mechanism for chuck fixation, the heat generating member (that is, the dielectric member and the electrode) is disposed at the chuck side. Moreover, although it is not shown in the drawings, the chuck may be cooled on the basis of radiation, as disclosed in Japanese Laid-Open Patent Application No. 2003-58258. Thus, by combining the subjects to be cooled into one, the cooling mechanism can be made simple. Further, although the heat produced by the chuck may flow into the stage through the contact surface between them, since the contact surface with the stage is at the three points in this embodiment and, yet, the contact area is made as small as possible, actually, substantially no heat is transmitted to the stage.

In this embodiment, three protrusions are provided at the bottom face of the chuck to constitute the three-point support. However, three protrusions may be provided that the stage side as shown in FIG. 10. Namely, the structure of the three-point supporting members itself is not the essence of the present embodiment. Rather, in accordance with an important feature of this embodiment, a non-contact attracting portion is defined around the three-point supporting portions, by which the function of the three-point support can be achieved while securing the attracting force.

Now, electrical transfer between the electrostatic chuck 1 and the stage 9 will be explained. As shown in FIGS. 4 and 5, the wafer attracting electrodes $3a$, $3b$ and $3c$ are electrically connected to electrically conductive protrusions 10 provided at the three-point supporting members 4. Further, the electrodes $3d$, $3e$ and $3f$ for chuck fixation are all connected to the electrode $3b$, that is, to the electrically conductive protrusion 10. With such a connection, there are three electrical transfers defined between the stage 9 and the chuck 1, and this can meet the three protrusions. As regards the electrodes $3d$-$3e$ for chuck fixation, since the attracting force at the electrode $3c$ varies its applied voltage because the applied voltage thereof should be adjusted and, also, since a large applied voltage should be set for the electrode $3a$, the electrodes $3d$-$3f$ are connected to the remaining electrode $3b$ having its applied voltage balanced well. However, since the present embodiment aims at reducing the number of electrical connections between the stage 9 and the chuck 1 as much as possible, these electrodes may be connected to any other electrode, in dependence upon the design. Alternatively, the electrodes may be connected in a one-on-one relation like $3a$ to $3d$, $3b$ to $3e$, and $3c$ to $3f$. Further, it is not always necessary to connect the wafer attracting electrode ($3a$, $3b$, $3c$) and the chuck fixing electrode ($3d$, $3e$, $3f$) with each other. If, for example, the chuck is provided with two wafer attracting electrodes and three chuck fixing electrodes, the two wafer attracting electrodes may be connected to two electrically conductive protrusions 10, respectively, while all three chuck fixing electrodes may be connected to a single conductive protrusion 10.

Next, the structure of the stage 9 side for fixedly supporting the chuck 1 will be explained. The stage 9 is provided with voltage supplying terminals 13 to be associated with the conductive protrusions 10 of the chuck 1, each terminal having a diameter corresponding to or larger than the protrusion 10. Electrical wires are connected to these terminals, so that voltages corresponding to the electrodes, respectively, can be applied to them. Also, in association with the chuck fixing electrodes 3*d*-3*f*, there are earth electrodes 12 each being grounded. For providing insulation between the voltage supplying terminal 13 and the earth electrode 12, there is an insulating member 14 provided between them.

Figure 7:
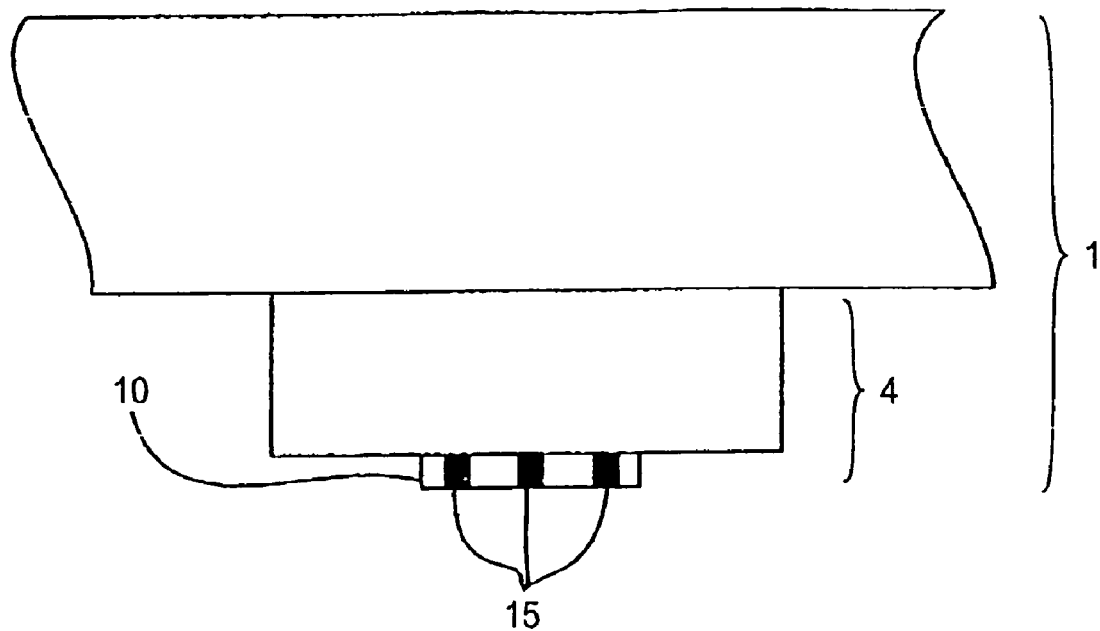
FIG. 7 is a schematic view for explaining an example wherein a supporting member is made of an insulative material and it is provided with a voltage applying terminal.
Figure 8:
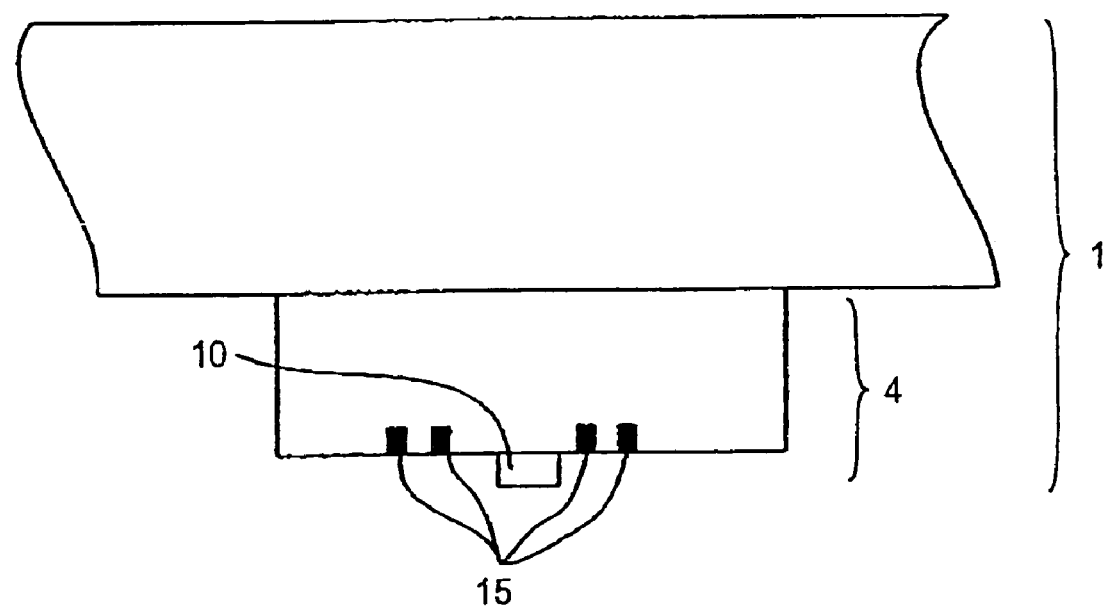
FIG. 8 is a schematic view for explaining another example wherein a supporting member is made of an insulative material and it is provided with a voltage applying terminal.

In the foregoing, the structure that enables a three-point chuck supporting structure most effectively has been described. Practically, however, in some cases, it is not easy to ensure electrical connections between the chuck and the stage, of a number not greater than three. In such a case, as shown in FIG. 7, a plurality of voltage supplying terminals 15 may be provided at an insulating protrusion 10, and the difficulty can be met thereby. As a further alternative, voltage supplying terminals 15 may be provided around a protrusion 10, as shown in FIG. 8. In these two examples, the connection with the voltage supplying terminals 15 may be accomplished by engaging thereto a terminal constituted by a leaf spring, for example, provided at the stage side. Although these two examples are excluded from an idealistic three-point supporting structure, if the area of the three supporting portions and of the portions around them is very small as compared with the whole area of the chuck, almost all the technical advantages of the three-point supporting structure can be retained. As a further alternative, the plurality of voltage supplying terminals 15 may be provided upon the contact surfaces of the insulative protrusions 10, to be engaged with the stage, or they may be provided at a portion around (adjacent to) the insulative protrusion, to be opposed to the stage.

Third Embodiment

Figure 9:
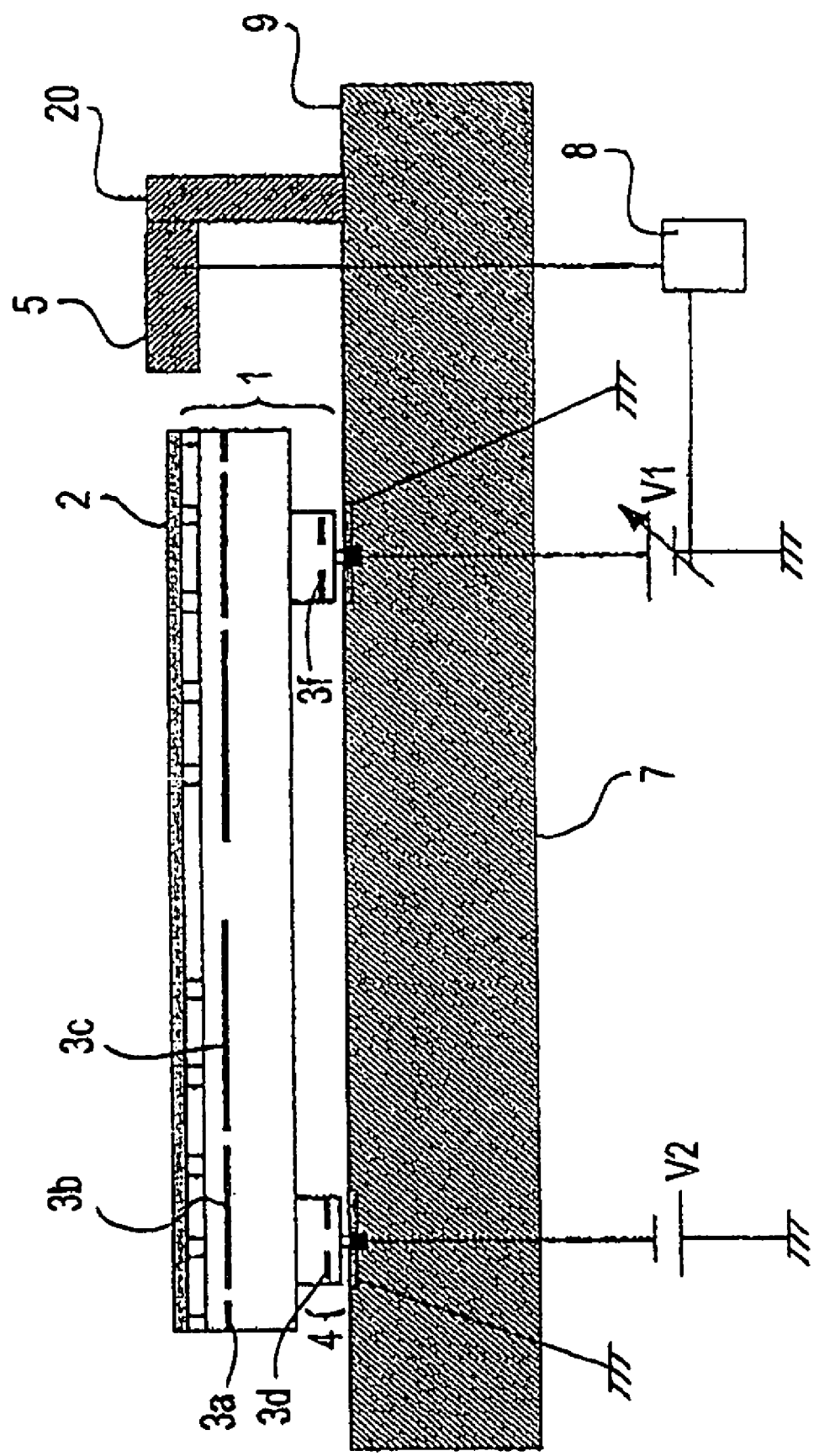
FIG. 9 is a schematic view of a general structure of a stage system according to a third embodiment of the present invention.

FIG. 9 shows a third embodiment. Although the first and second embodiments relate to the structure that a non-contact electrometer probe 5 is opposed to the bottom face of a wafer 2, this embodiment shows a structure in which the wafer potential is measured by providing a non-contact electrometer probe 5 disposed opposed to a side face of the wafer 2. More specifically, the probe 5 is mounted on a supporting pillar 20 provided on the top surface of the stage 9, at a right angle thereto, so that it is placed opposed to the side face of the wafer. Here, if the stage 9 is a fine-motion stage of a stage system that includes a rough-motion stage 16 and a fine-motion stage 9, as shown in FIG. 1, an opening or notch may be formed in such a portion of the fine-motion stage 9 that is positioned outside the wafer 2 and the chuck 1, and also, the supporting pillar 20 may be one that is provided on the rough-motion stage 16 and extends through the opening or notch of the fine-motion stage 9 up to the wafer 2 level. The remaining structure and function of this embodiment may be essentially the same as that of the first or second embodiment, and a duplicate description is omitted here.

Usually, a wafer is coated with a resist. In recent years, however, for the purpose of avoiding the possibility of dust particles caught between a wafer and a chuck, the bottom face of the wafer, as well as the side face thereof, are washed and, therefore, any resist material at the side face and bottom face is removed completely. As a result, when the wafer bottom face or side face is used as the target of potential measurement, as in the embodiments of the present invention described hereinbefore, the adverse influence of the resist material can be avoided sufficiently, such that an error factor for measurement of a surface potential can be removed effectively.

By providing a throughbore for an electrometer, in a chuck, as in the first and second embodiments as described hereinbefore, the non-contact electrometer can be disposed with a simple structure and without interfering with the charged particle beam pattern drawing operation. This facilitates application of a method of controlling the wafer potential to 0V without use of a grounding needle. Also, as regards the chuck fixing method, a non-contact attracting force may be produced around the chuck supporting members as in the second embodiment, and this secures an attracting force even if the supporting members are made small. Further, by the connecting chuck fixing electrode and the substrate attracting electrode with each other, the number of transferring wires or electrical connections with the base member can be reduced. Furthermore, the three-point supporting members for chuck fixation may be used also as voltage supplying terminals, and on that occasion, the technical advantages of the three-point supporting fixation can be maximized.

Fourth Embodiment

Next, referring to FIGS. 12 and 13, an embodiment of a device manufacturing method, which uses an exposure apparatus described above, will be explained.

Figure 12:
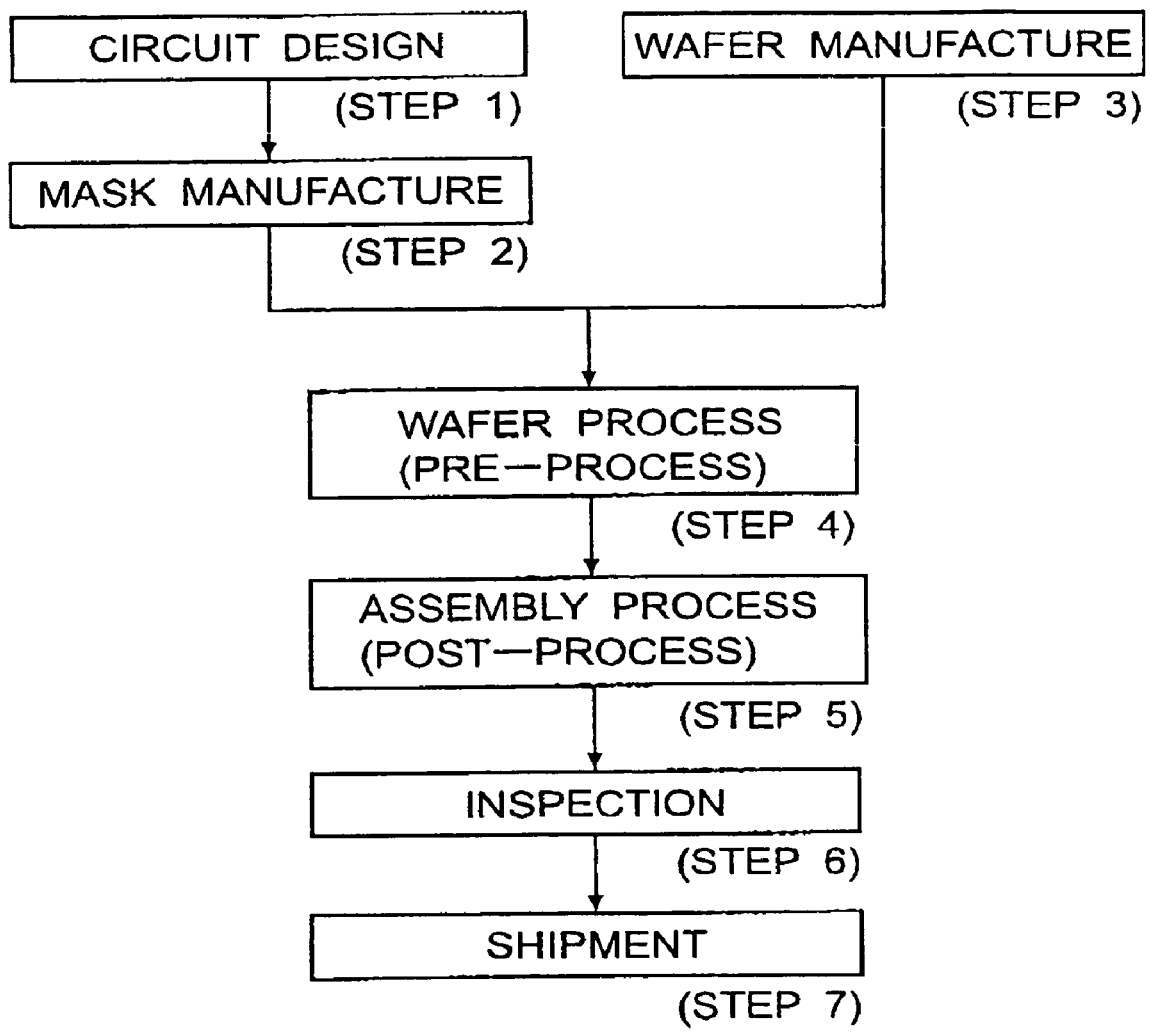
FIG. 12 is a flow chart for explaining the procedure of device manufacture.

FIG. 12 is a flow chart for explaining the procedure of manufacturing various microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5 subsequent to this is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

Figure 13:
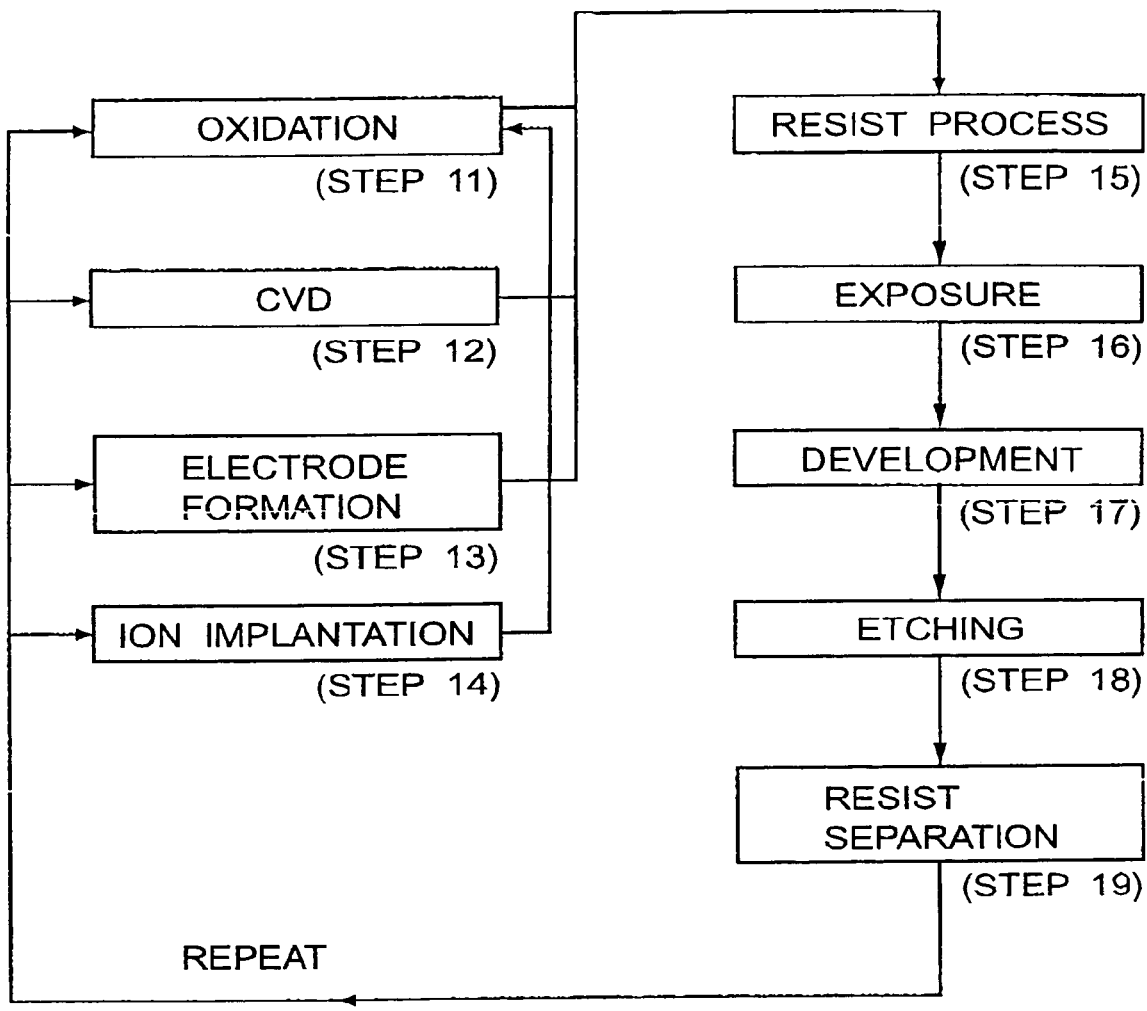
FIG. 13 is a flow chart for explaining details of a wafer process included in the procedure of FIG. 12.

FIG. 13 is a flow chart for explaining details of the wafer process. Step 111 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

Fifth Embodiment

Figure 14:
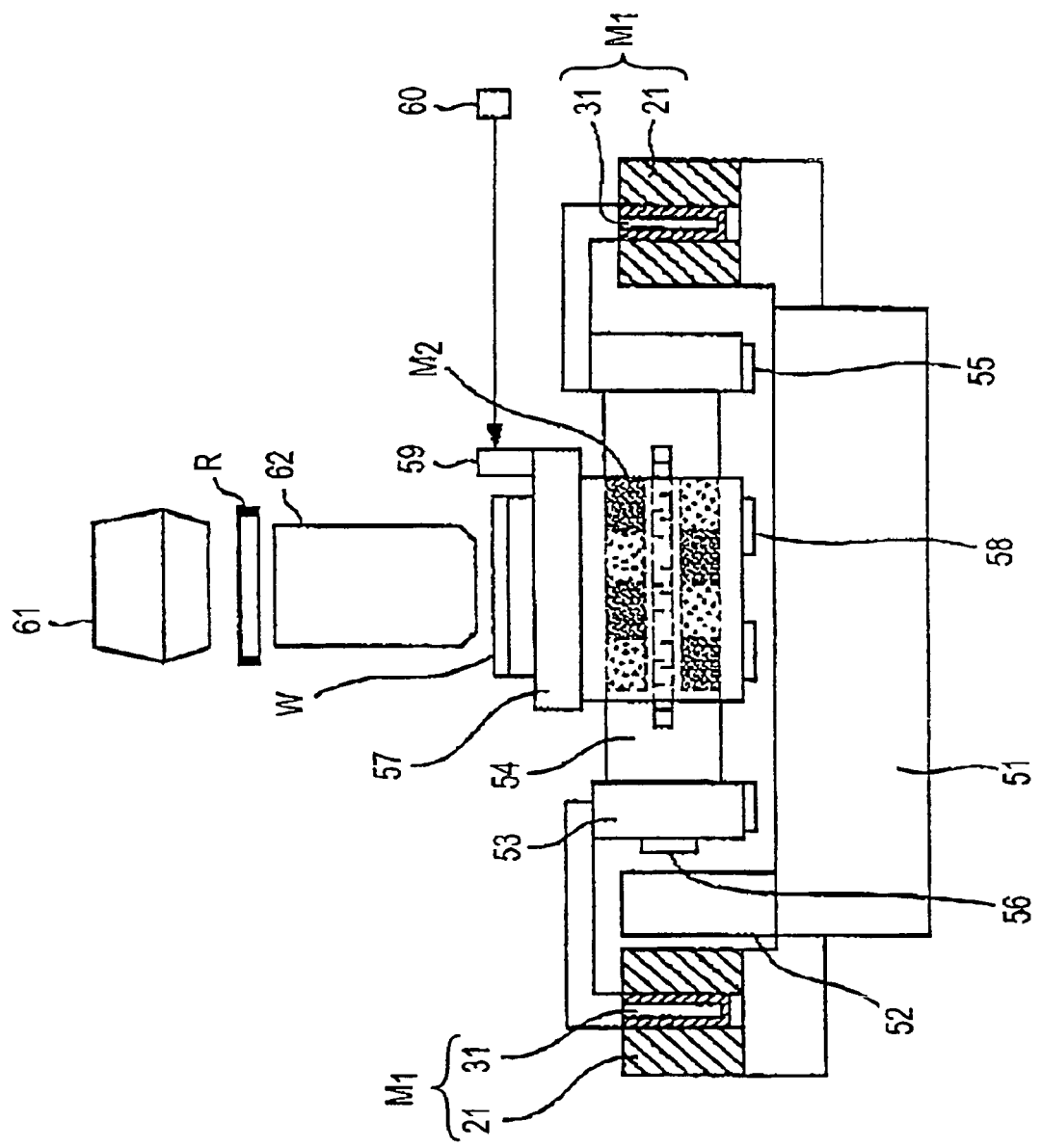
FIG. 14 is a schematic view of a general structure of a device manufacturing exposure apparatus.

FIG. 14 shows a device manufacturing exposure apparatus in which a stage system having a substrate holding structure, such as described hereinbefore, is incorporated as a wafer stage.

The exposure apparatus of this embodiment can be used for device manufacture for microdevices such as a semiconductor device (e.g., a semiconductor integrated circuit), a micro-machine, or a thin-film magnetic head, for example. It is arranged so that exposure light (generally used to refer to various energies such as visible light, ultraviolet light, EUV light, X-rays, electron beams, charged particle beams, and so on) as exposure energy is projected from a light source 61 onto a semiconductor wafer W (substrate) by a projection lens 62 (generally used to refer to various optical elements such as a refractive lens, a reflection lens, a catadioptric lens system, a charged particle lens, and so on), as a projection system, through a reticle R (original). By this, a desired pattern can be formed on the substrate W.

In this exposure apparatus, a guide 51 and a linear motor stator 21 are fixedly mounted on a base table 51. The linear motor stator 21 comprises a multi-phase electromagnetic coil, and a linear motor movable element 31 comprises a permanent magnet group. The linear motor movable element 31 is connected as a movable element 53 to a movable guide 54 (stage), and with the drive of the linear motor M1, the movable guide 54 is moved along a direction of a normal to the sheet of the drawing. The movable portion 53 is supported by a static pressure bearing 55 with reference to the upper surface of the base table 51, while, on the other hand, it is supported by a static pressure bearing 56 with reference to the side face of the guide 52.

A movable stage 57 is a stage, which is provided to straddle the movable guide 54, and it is supported by a static pressure bearing 58. The stage 57 is driven by a linear motor M2 similar to the motor M1, and it can move in leftward and rightward directions in the sheet of the drawing, with reference to the movable guide 54. The motion of the movable stage 57 is measured by means of a mirror 59, fixedly mounted on the movable stage 57, and an interferometer 60.

The wafer W (substrate) is placed on a chuck, which is mounted on the movable stage 57, and a pattern of the reticle R (original) is transferred in a reduced scale to different regions on the wafer W through a step-and-repeat operation or step-and-scan operation.

Here, it should be noted that this embodiment can particularly suitably be applied to an exposure apparatus of the type that, without use of a reticle R, a circuit pattern is directly drawn on a semiconductor wafer by use of a charged particle beam.

The present invention is not limited to the embodiments described hereinbefore. It can be applied with appropriate modifications within the scope of the invention. For example, although in the embodiments described above the invention has been applied to an exposure apparatus, the present invention is applicable also to a charged particle beam pattern drawing apparatus wherein a desired pattern is produced on a substrate by use of a charged particle beam such as an electron beam or ion beam, for example, or, alternatively, to a sample observation system, a precision measuring system, and so on. In such a sample observation system, the substrate may be a planar sample itself or a substrate on which the sample is placed. When the substrate is a semiconductor wafer, the portion where a pattern is formed is, like the portion coated with a resist, included as the portion where the bare material of the substrate is not cropped out.

As described hereinbefore, the present invention provides an effective and superior technique in relation to the substrate holding.

While the invention has been described with reference to the structure disclosed herein, it is not confined to the details set forth and this application is intended to cover such modifications or changes as may come within the purposes of the improvements or the scope of the following claims.

This application claims priority from Japanese Patent Application no. 187432/2003 filed Jule 30, 2003, which is hereby incorporated by reference.

What is claimed is:

1. A stage system, comprising:
a fine-motion stage on which a substrate holding member for holding a substrate is mounted;
a rough-motion stage on which said fine-motion stage is mounted, without contact; and
a chopper-type probe configured to measure a potential of the substrate without contact thereto,
wherein said probe is supported by said rough-motion stage without contact to said fine-motion stage and is disposed so as to be opposed to one of a bottom face and a side face of the substrate.

2. A stage system according to claim 1, wherein said rough-motion stage supports said probe so that said probe is opposed to the bottom face of the substrate through said substrate holding member mounted on said fine-motion stage.

3. A stage system according to claim 1, wherein said rough-motion stage supports said probe so that said probe is opposed to the substrate through said fine-motion stage.

4. A stage system according to claim 3, wherein said rough-motion stage supports said probe so that said probe is opposed to the bottom face of the substrate through said fine-motion stage and said substrate holding member.

5. A stage system according to claim 3, wherein said rough-motion stage supports said probe so that said probe is opposed to the side faces of the substrate through a support pillar extending through said fine-motion stage.

6. A stage system according to claim 2, further comprising a plurality of terminals configured to adjust a potential of a plurality of electrodes provided in said substrate holding member.

7. A stage system according to claim 6, further comprising a control device configured to control a potential of a terminal, of said plurality of terminals, having a smallest absolute value of a set potential, on the basis of the potential of the substrate measured by said probe.

8. A stage system according to claim 6, further comprising a control device configured to control a potential of a terminal, of said plurality of terminals, that corresponds to an electrode, of said plurality of electrodes, having a largest area, on the basis of the potential of the substrate measured by said probe.

9. A stage system, comprising:
a substrate holding member;
a first electrode provided on said substrate holding member and configured to electrostatically attract a substrate;
a stage configured to carry said substrate holding member thereon and to move;
only three protrusions provided on one of said substrate holding member and said stage and configured to support said substrate holding member relative to said stage; and
a second electrode provided around said protrusions and configured to electrostatically attract said substrate holding member toward said stage.

10. A stage system according to claim 9, further comprising a terminal configured to adjust a potential of said second electrode, wherein said terminal is further configured to adjust a potential of said first electrode.

11. An exposure apparatus for exposing a substrate to a pattern, said exposure apparatus comprising:
a stage system comprising:
(i) a fine-motion stage on which a substrate holding member for holding a substrate is mounted;

(ii) a rough-motion stage on which said fine-motion stage is mounted, without contact; and (iii) a chopper-type probe configured to measure a potential of the substrate without contact thereto, wherein said probe is supported by said rough-motion stage without contact to said fine-motion stage and is disposed so as to be opposed to one of a bottom face and a side face of the substrate.

12. A device manufacturing method comprising:

a step of exposing a substrate to a pattern by use of an exposure apparatus, which includes a stage apparatus comprising:

(i) a fine-motion stage on which a substrate holding member for holding a substrate is mounted;

(ii) a rough-motion stage on which the fine-motion stage is mounted, without contact; and (iii) a chopper-type probe configured to measure a potential of the substrate without contact thereto, wherein the probe is supported by the rough-motion stage without contact to the fine-motion stage and is disposed so as to be opposed to one of a bottom face and a side face of the substrate.

13. An exposure apparatus for exposing a substrate to a pattern, said exposure apparatus comprising:

a stage system comprising:

(i) a substrate holding member;

(ii) a first electrode provided on said substrate holding member and configured to electrostatically attract a substrate;

(iii) a stage configured to carry said substrate holding member thereon and to move, wherein only three protrusions are provided on one of said substrate holding member and said stage and configured to support said substrate holding member relative to said stage; and (iv) a second electrode provided around said protrusions and configured to electrostatically attract said substrate holding member toward said stage.

14. A device manufacturing method comprising:

a step of exposing a substrate to a pattern by use of an exposure apparatus, which includes a stage apparatus comprising:

(i) a substrate holding member;

(ii) a first electrode provided on the substrate holding member and configured to electrostatically attract a substrate;

(iii) a stage configured to carry the substrate holding member thereon and to move, wherein only three protrusions are provided on one of the substrate holding member and the stage and configured to support the substrate holding member relative to the stage; and (iv) a second electrode provided around the protrusions and configured to electrostatically attract the substrate holding member toward the stage.

* * * * *